United States Patent
Park et al.

(10) Patent No.: US 7,075,325 B2
(45) Date of Patent: Jul. 11, 2006

(54) METHOD AND APPARATUS FOR TESTING SEMICONDUCTOR DEVICES USING AN ACTUAL BOARD-TYPE PRODUCT

(75) Inventors: Sang-Jun Park, Cheonan (KR); Chang-Nyun Kim, Cheonan (KR); Hyun-Ho Park, Cheonan (KR); Nam-Sik Jeong, Suwon (KR); Jong-Hyun Kim, Suwon (KR); Chung-Koo Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/982,646

(22) Filed: Nov. 3, 2004

(65) Prior Publication Data

US 2005/0057272 A1 Mar. 17, 2005

Related U.S. Application Data

(62) Division of application No. 09/733,336, filed on Dec. 8, 2000, now Pat. No. 6,833,721.

(30) Foreign Application Priority Data

Apr. 19, 2000 (KR) .................................. 00-20653

(51) Int. Cl.
*G01R 31/26* (2006.01)
(52) U.S. Cl. .................................... 324/765; 324/158.1
(58) Field of Classification Search ............... 324/73.1, 324/527, 537, 755, 760, 765, 158.1; 714/724, 714/738; 702/118–119; 361/719–722, 736–738, 361/760–764
See application file for complete search history.

(56) References Cited

U.S. PATENT DOCUMENTS 4,906,987 A 3/1990 Venaleck et al.

(Continued)

FOREIGN PATENT DOCUMENTS

KR 1020000049650 8/2000

(Continued)

OTHER PUBLICATIONS

English language abstract of Korean Publication No. 1020010096955.

(Continued)

*Primary Examiner*—Minh N. Tang
(74) *Attorney, Agent, or Firm*—Marger Johnson & McCollom, P.C.

(57) ABSTRACT

Semiconductor devices are tested under actual operating conditions by interfacing the devices to an actual board-type product, for example, through a test board tat includes a mounting unit such as a socket or pattern of conductive lands that allows the devices being tested to be mounted to and removed from the test board with minimal effort and signal degradation. An interface circuit on the test board compensates for environmental differences between the board-type product and the mounting unit. For example, the interface circuit can include a clock distribution circuit, which utilizes a phase locked loop, and a register circuit to compensate for electrical loading caused by the device mounting unit, and to provide the proper timing margins between clock signals and control signals applied to the semiconductor devices. A power control circuit can be used to manipulate the supply voltage thereby providing a voltage margin screening function.

20 Claims, 4 Drawing Sheets

U.S. PATENT DOCUMENTS

| | | | |
|---|---|---|---|
| 4,998,180 A * | 3/1991 | McAuliffe et al. | 361/684 |
| 5,387,861 A * | 2/1995 | Neiderhofer | 324/158.1 |
| 5,794,175 A | 8/1998 | Conner | |
| 5,966,021 A | 10/1999 | Eliashberg et al. | |
| 6,021,048 A * | 2/2000 | Smith | 361/736 |
| 6,234,820 B1 * | 5/2001 | Perino et al. | 439/326 |
| 6,347,039 B1 * | 2/2002 | Lee | 361/760 |
| 6,505,317 B1 | 1/2003 | Smith et al. | |

FOREIGN PATENT DOCUMENTS

KR   1020010096955   11/2001

OTHER PUBLICATIONS

English language abstract of Korean Publication No. 1020000049650.

* cited by examiner

METHOD AND APPARATUS FOR TESTING SEMICONDUCTOR DEVICES USING AN ACTUAL BOARD-TYPE PRODUCT

This application is a divisional of U.S. patent application Ser. No. 09/733,336, filed on Dec. 8, 2000, now issued as U.S. Pat. No. 6,833,721, which is herein incorporated by reference in its entirety.

BACKGROUND OF THE INVENTION

1. Field of the Invention

The present invention relates generally to test technology for semiconductor devices, and more particularly to a method and apparatus for testing semiconductor devices using an actual board-type product.

2. Description of the Related Art

Figure 1:
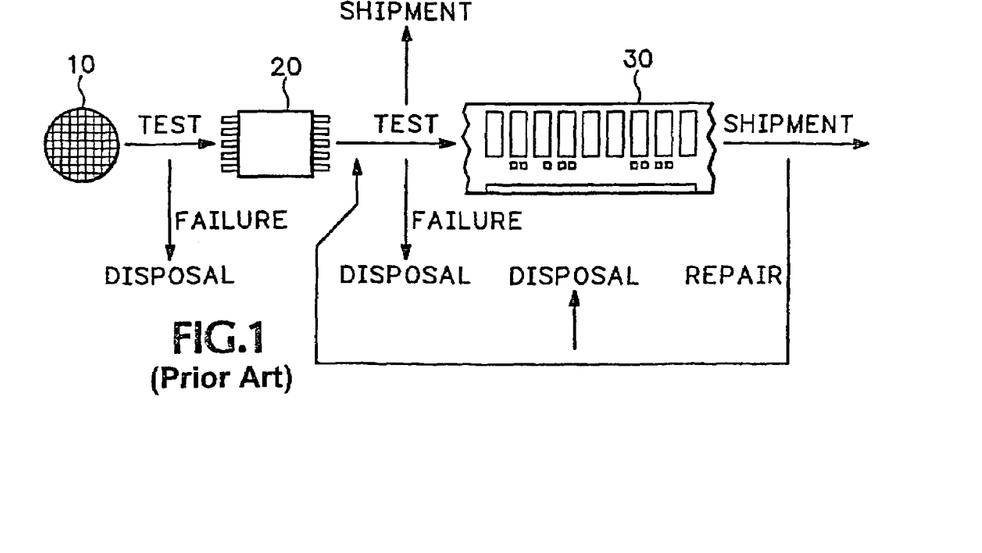
FIG. 1 illustrates a conventional process for testing semiconductor devices.

FIG. 1 illustrates a conventional process for fabricating and testing semiconductor integrated circuit devices and the printed circuit boards onto which they are typically assembled. First, numerous semiconductor devices are fabricated on a semiconductor wafer 10. The semiconductor devices are then tested during a wafer-level test, and faulty devices are marked so that they can be sorted and disposed of after they are separated from the wafer during a wafer separation process.

Next, the semiconductor devices that pass the wafer-level test are assembled into packages. The packaged devices 20 are then tested for reliability using a burn-in test, which screens for early defects under extreme temperature and electrical conditions, and a functional test, which tests the electrical characteristics of the devices. Packaged devices that fail either of these tests are disposed of, and the remaining devices are either assembled into printed circuit board products (such as the memory module 30 shown in FIG. 1), or they are sold to other manufacturers who assemble them into their own board-type products. The board-type products are then tested again after assembly.

A problem with the conventional test process described above is that the test conditions are not the same as the actual operating conditions that the semiconductor devices encounter during actual use. Therefore, even if a semiconductor device passes the burn-in and functional tests, it might still have a defect that cannot be detected until after it is assembled into a board-type product. This increases product costs due to the expense associated with repairing and retesting boards, and the waste associated with boards that cannot be repaired. For example, semiconductor memory devices are typically assembled onto board-type memory modules such as Single Inline Memory Modules (SIMMs) or Dual Inline Memory Modules (DIMMs) which contain numerous memory devices. The modules are then mounted to a piece of equipment such as a computer mother board through a board-edge connector. If the module contains a single memory device that fails to operate properly when the module is installed on an actual mother board, the entire module must typically be disposed of because it is expensive to remove and replace one of the memory devices, which are soldered onto the module.

Moreover, even if a defective semiconductor device operates properly when initially assembled into a board-type product, it might malfunction long after it has been shipped from the manufacturer when it is subjected to different operating conditions. This further increases product costs due to warranty returns and replacements and results in a loss of consumer confidence.

A further problem with the prior art test process described above is that conventional test equipment is complicated, bulky and expensive. For example, semiconductor memory device manufacturers typically utilize integrated circuit testers such as the Hewlett Packard model HP83000 tester and the Advan tester to test memory devices after they have been assembled into packages. These testers generate test signal patterns that simulate memory bus signals (e.g., clock, row address strobe (RAS), column address strobe (CAS), data, and address signals) that a memory device would receive from a central processing unit (CPU) or chipset when utilized in a board level device. The test signals are applied to the terminal leads of the memory device under test (DUT), and the tester analyzes the signals received back from the memory device to determine if the electrical characteristics are acceptable. This type of tester is capital-intensive and takes up floor space that would be better utilized for fabrication equipment. Although this type of tester is very flexible and can be programmed to test a wide range of device characteristics, it cannot provide an environment identical to that encountered during actual operation. Moreover, to provide this flexibility, the tester must necessarily be complicated, and therefore, difficult and expensive to program and operate.

SUMMARY OF THE INVENTION

One aspect of the present invention is a test board for testing semiconductor devices comprising a circuit board having a mounting unit for mounting a semiconductor device to the board and a connector for coupling the test board to a board-type product. An interface circuit on the test board couples the mounting unit to the board-type product and compensates for environmental differences between the board-type product and the mounting unit.

Another aspect of the present invention is a test board for testing semiconductor devices comprising a circuit board having a mounting unit for mounting a semiconductor device to the board and a connector for coupling the test board to a board-type product. A power control circuit manipulates the power supply provided to the semiconductor device.

A further aspect of the present invention is a system for testing semiconductor devices comprising a board-type product and a test board which can be coupled to the board-type product. The test board includes a mounting unit for mounting a semiconductor device to the test board which couples signals from the board-type product to the semiconductor device to allow the device to be tested under actual operating conditions.

Another aspect of the present invention is a method for testing semiconductor devices by coupling a test board to a board-type product, mounting a semiconductor device on the test board, and testing the semiconductor device by operating the board-type product.

DETAILED DESCRIPTION

The present invention provides improved technology for testing semiconductor devices by interfacing the devices to an actual board-type product, which, when operated, allows the devices to be tested in an actual operating environment. The semiconductor devices can be interfaced to the board-type product with a test board. A test board in accordance with the present invention is preferably constructed so that the semiconductor devices being tested can be easily mounted to and removed from the board with minimal effort and signal degradation. A test board according to the present invention can also be constructed so as to compensate for device mounting units such as sockets, to eliminate skew between signals on the board-type product and the test board, to control signal patterns provided to the semiconductor devices, to compensate for the drive capacitance of the signals provided to the semiconductor devices, to manipulate the power supply provided to the semiconductor devices, and to perform other useful functions as described in more detail below.

As used herein, the term board-type product refers not only to products fabricated on conventional printed circuit boards, but to any article of manufacture that is intended to actually use the semiconductor device being tested for the purpose for which the device is intended, even if the board-type product is not fabricated on a printed circuit board, e.g., multi-chip modules (MCMs), flexible circuit boards, or even devices that are not fabricated on a "board" per se, or are as yet unknown.

Figure 2:
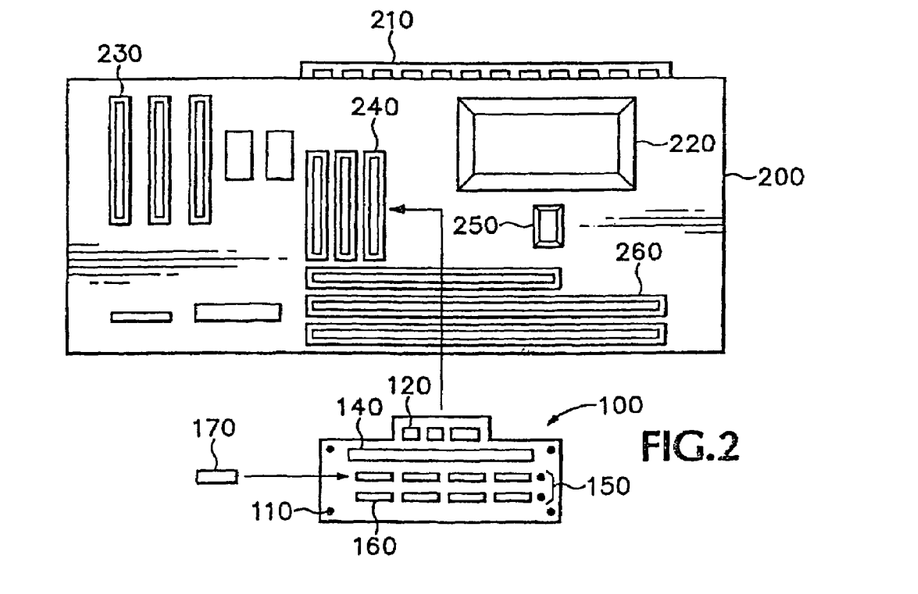
FIG. 2 illustrates an embodiment of a system for testing semiconductor devices in accordance with the present invention.

FIG. 2 illustrates an example embodiment of a system for testing semiconductor devices in accordance with the present invention. The system of FIG. 2 includes a board-type product 200, which, in this example, is a mother board for a computer, and a test board 100. The test board is constructed so that semiconductor devices, in this example, memory devices, can be easily mounted to and removed from the test board. Using the apparatus of FIG. 2, a memory device can be tested under actual operating conditions by mounting the device to the test board, coupling the test board to the mother board, and then operating the mother board. Although the example system of FIG. 2 is designed for testing memory devices with a computer mother board, this is only an illustrative example, and the present invention allows other types of semiconductor devices to be tested with other board-type products such as products for server computers, communication appliances, switching equipment, etc.

The test board 100 is based on a circuit board 110 which is preferably fabricated using multi-layer printed circuit board technology and includes a power layer, a ground layer, and one or more signal layers which have insulating layers (typically made of fiberglass) laminated between them. A mounting section 150 of the board includes one or more mounting units 160 which are designed to make it as easy as possible to mount one or more semiconductor devices 170 to the board and then remove them after the test is completed so that a new batch of devices can be mounted and tested. Conventional integrated circuit (IC) sockets can be used as the mounting units. If IC sockets are used they are preferably the contact-type sockets, although less expensive test sockets can be used as well. As another solution, the mounting units can be implemented as conductive land patterns formed on the circuit board when the circuit traces are being formed. The semiconductor devices can then be mounted on the test board by contacting the outer leads of the device to corresponding lands on the board.

The test board 100 also includes a connector 120, which couples the test board to the board-type product, and an interface circuit 140, which interfaces the mounting unit to the board-type product and compensates for environmental differences between the board-type product and the mounting unit.

The board-type product 200, which, as mentioned above, is a mother board for a computer in this example, includes an I/O connector 210, a CPU 220, Peripheral Component Interconnect/Industry Standard Architecture (PCI/ISA) slots 230, memory slots 240, a power connector 250, and peripheral component connectors 260. The memory slots 240 are typically either SIMM or DIMM slots which are design to accept memory modules on which the memory devices are usually mounted. The test board of FIG. 2 is constructed so that the connector 120 plugs into one or more of the memory slots 240, and the interface circuit 140 and mounting units 160 are interconnected so that, to the mother board, the test board appears to operate as a memory module.

Many board-type products have a component side, on which all or most of the components are mounted, and a back side, which typically has few, if any, components. In a preferred embodiment, the mother board is modified so that the connectors for the memory slots project from the back side of the board. By allowing the test board to be coupled to the back side of the mother board, this provides extra clearance between components on the mother board and the test board and allows the test board to be oriented in positions that might otherwise be impossible if the connectors for the memory slots are mounted on the component side.

Figure 3:
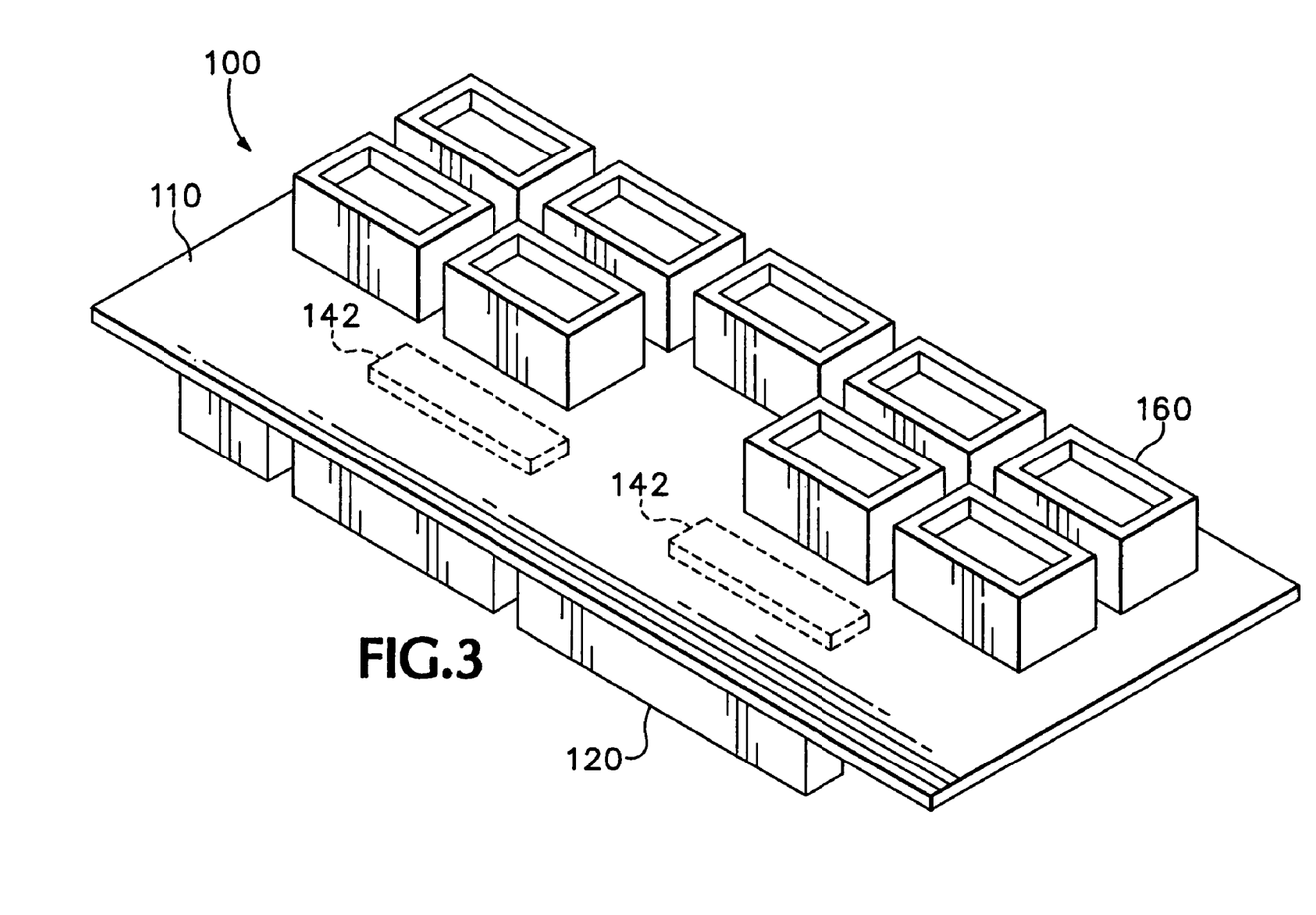
FIG. 3 is a perspective view of an embodiment of a test board in accordance with the present invention.

FIG. 3 is a perspective view of an embodiment of a test board 100 in accordance with the present invention. The mounting units 160 shown in FIG. 3 are attached or formed on the back side of the circuit board 110, while the connector 120 (shown here having three sections) is attached to the component side on which the integrated circuits 142 making up the interface circuit 140 are mounted.

Figure 4:
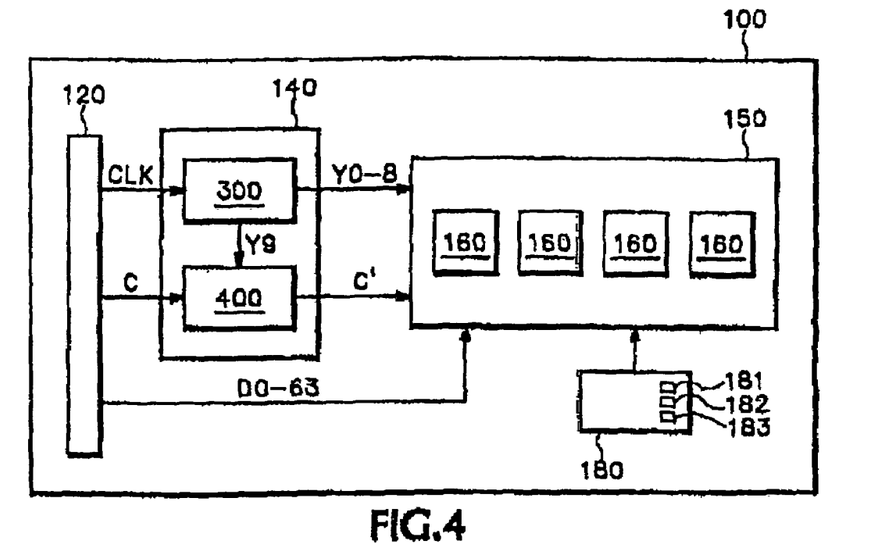
FIG. 4 is a block diagram of an embodiment of a test board in accordance with the present invention.

FIG. 4 is a block diagram of one embodiment of a test board 100 in accordance with the present invention. The interface circuit 140 is coupled between the connector 120 and the mounting units 160 located in the mounting section 150. The interface circuit 140 is designed to compensate for environmental differences between the board-type product and the mounting units so that the signal patterns received by devices in the mounting units are the same as the devices would encounter under actual operating conditions. Some possible techniques for compensating for environmental differences include adapting the interface circuit to control the timing margin between various signals, to control the rise and fall times of various signals, to control various AC parameters of signals, to control overshoot and undershoot, to control skew and jitter, and/or to control other aspects of the signals used on the test board, as may be necessary.

In the embodiment shown in FIG. 4, the interface circuit includes a clock distribution circuit 300 and a register circuit 400. The clock distribution circuit receives a clock signal CLK from the connector and uses it to generate one or more clock signals Y, which are distributed to the mounting units 160. The clock distribution circuit also generates another clock signal Y9 which is used by the register circuit if necessary. The register circuit receives various control signals C from the connector and distributes them as C' to the mounting unit depending on the device being tested. In this case, the control signals C include RAS, CAS, and the like. Data signals D, such as data signals D0–63 for a memory device, are routed directly from the connector to the mounting unit.

The test board 100 of FIG. 4 preferably includes a power filtering circuit 180 which conditions the power applied to the devices mounted in the mounting units. The power filtering circuit includes bypass capacitors, bulk capacitors, and decoupling capacitors which cut off noise in the power supplied to the mounting units, serve as batteries to maintain power in the event of sudden power fluctuations, and compensate for the parasitic reactance of any sockets that might be used as mounting units. The capacitors can be connected between the power supply and ground terminals of the interface board, or alternatively, between an anode power terminal and cathode power terminal of a semiconductor device mounted on the interface board. The power filtering circuit can also be used as a point of access for connecting an external power supply to provide power to the devices in the mounting units rather than operating the mounting units from whatever power supply is available from the board-type product. One drawback of the power filtering circuit is that it can provide a power supply that is more stable than under actual operating conditions. Therefore, as a further refinement, the number of capacitors can be reduced and adjusted so that the power supply provided to the mounting units is no more stable than under actual operating conditions.

Figure 5:
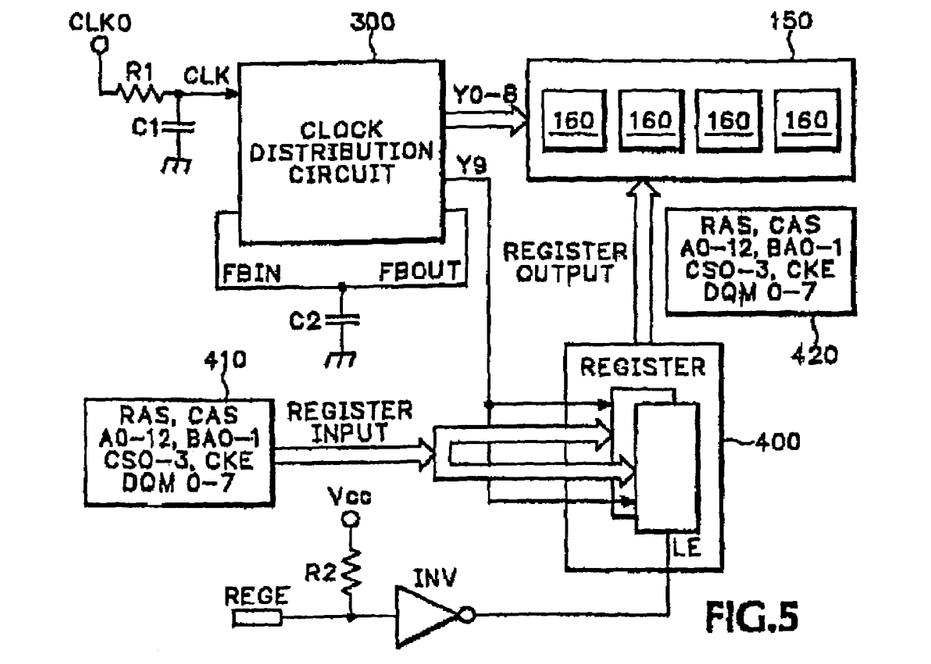
FIG. 5 is a schematic block diagram of another embodiment of a test board in accordance with the present invention.

FIG. 5 is a schematic block diagram showing more details of another embodiment of a test board in accordance with the present invention. A clock signal CLK0, which is received from the board-type device through the connector (not shown) of the test board, is filtered by R1 and C1 to generate the input signal CLK to the clock distribution circuit. The clock distribution circuit 300 uses a phase locked loop (PLL) to generate multiple clock signals Y0–Y8, Y9 which are coupled to the mounting units 160, and register circuit 400, respectively. The clock distribution circuit is preferably adjusted so that the clock signals Y0–8, which are received by the mounting units, have the same phase as the clock signal CLK0 from the board-type product. Since the combination of R1 and C1 tend to delay the timing of the clock signal CLK, the PLL is preferably adjusted to advance the timing of the signals Y0–8. This is accomplished by adjusting the size of capacitor C2 which is commonly connected to a feedback output terminal FBout and a feedback input terminal FBin.

The register circuit 400 receives register input signals 410 which are received at the connector (not shown) and are transmitted to the mounting units 160 as register output signals 420 in response to the clock signal Y9 from the clock distribution circuit. A latch enable signal LE enables and disables the register circuit in response to a register enable signal REGE which is generated by the system memory controller. When a high REGE signal is received, the inverter INV drives LE low, thereby causing the memory devices to operate normally. When no REGE signal is received from the system memory controller, the REGE signal is forced to a default high state by R2 which is connected to the power supply Vcc. In the embodiment of FIG. 5, the register input signals 410 and register output signals 420 include the control signals for controlling a memory device such as row address strobe (RAS), column address strobe (CAS), clock enable (CKE), address signals (A0–12), bank address signals (BA0–1), chip select signals (CS0–3), and data mask signals (DQM0–7).

One purpose of the register circuit is to buffer the signals 410, each of which might have to drive several inputs if there are a large number of devices mounted on mounting units 160 (a condition known as "fan-out"). Another purpose of the register circuit is to provide the drive power necessary to drive the control signals at high-speed to overcome the electrical loading caused by sockets if they are used as the mounting units.

A further purpose of the register circuit is to adjust the timing of the register output signals so that the signal patterns received by the devices in the mounting units are the same as under actual operating conditions. Whether the register circuit is necessary to adjust the signal timing depends on the type of semiconductor devices being tested and whether sockets are used as the mounting units as explained below. The register circuit is preferably a driver type of IC that can be operated in a register mode which delays the register output signals relative to the register input signals. This increases the timing margin of the control signals relative to the clock signals, so the timing of the clock signals should also be adjusted to maintain timing conditions that are the same as in actual usage.

One technique for adjusting the timing margin of the control signals is to provide the control signals directly to the mounting units 160 without using the register circuit 400 and adjust only the timing of the clock signals Y0–8 using the PLL. Another technique for adjusting the timing margin of the control signals is to provide the control signals to the mounting units 160 by operating the register circuit 400 in response to the clock signal Y9 from the clock distribution circuit.

Most personal computers utilize a 8-byte (64-bit) data bus, often with a 1-byte parity bus. Therefore, if the test board of FIG. 5 is used to test ×4 SDRAM memory devices in combination with, for example, an Intel Pentium III CPU on the mother board, 16 or 18 memory devices must be used in parallel to make up the bus. If the sockets are used as the mounting devices, then the register circuit 400 typically must be used to compensate for the electrical loading that the 16 or 18 sockets and devices place on the control signals. If ×8 SDRAM devices are tested using sockets as the mounting units, then it is still preferable to use the register circuit, but the timing might still work out correctly if it is not used. With ×16 SDRAM devices, the register circuit is usually not necessary because each control signal must only drive four devices, and only the clock distribution circuit need be adjusted to obtain the correct timing margins.

Different embodiments of test boards in accordance with the present invention should preferably be used for testing different types of memory devices. So for example, a test board for testing 4×16 SDRAM devices would preferably be designed with an interface circuit 140 that includes a clock distribution circuit 300, but not a register circuit 400.

As a further refinement, an additional resistor and capacitor can be added to the outputs of the register circuit to maintain signal integrity and realistic operating conditions. The resistor serve as terminations and prevent overshoot and under shoot caused by the strong current output from the register circuit. The capacitors serve a load matching function to correct any load imbalances which can occur if an odd number of sockets are used as the mounting units. That is, by matching the capacitance of the load matching capacitor to the capacitance of the odd-numbered socket, the load can be matched and noise reduced. In such situations, load matching capacitors are typically required on one of the clock signals, and one of the chip select signals.

Figure 6:
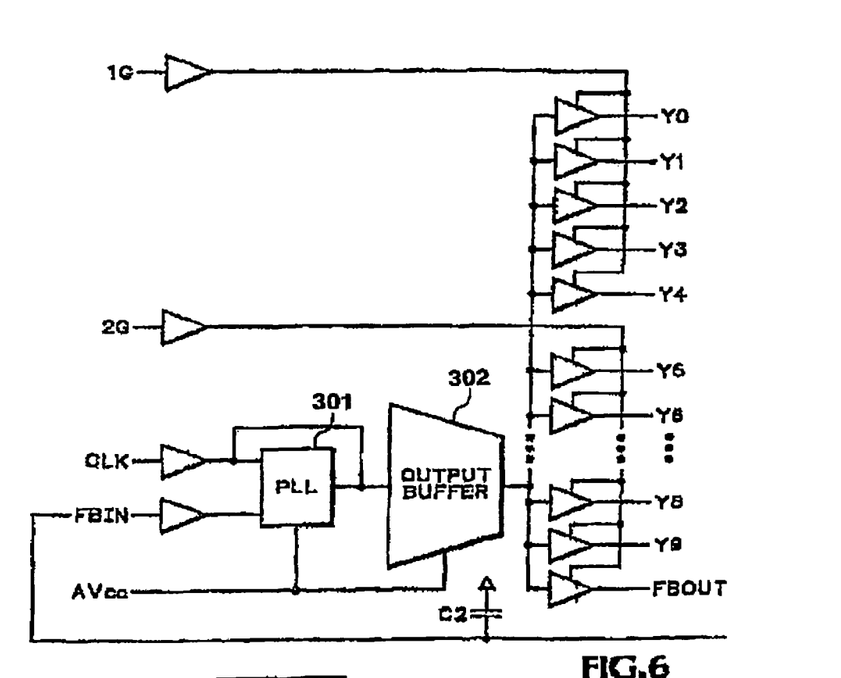
FIG. 6 is a schematic diagram of an embodiment of a clock distribution circuit in accordance with the present invention.

FIG. 6 is a schematic diagram showing more details of an embodiment of a clock distribution circuit in accordance with the present invention. The circuit of FIG. 6 includes a PLL 301 having an output buffer 302. Output clock signals Y0–Y4 and Y5–Y9 are controlled by bank enable signals 1G and 2G, respectively. The PLL is preferably designed so that the phase difference between the input clock signal CLK and the feedback input signal FBin is eliminated. Phase compensation is achieved by adjusting the propagation delay of the feedback line which is a function of the propagation speed and feedback line length, as well as the value of the capacitor C2 connected to the feedback line. Thus, adjusting capacitor C2 controls the timing between the input and output signals of the clock distribution circuit. This allows parameters such as set-up/hold time to be adjusted. An additional PLL analog power RC filter can optionally be connected between the power supply terminal AVcc terminal of the clock distribution circuit and ground.

Figure 7:
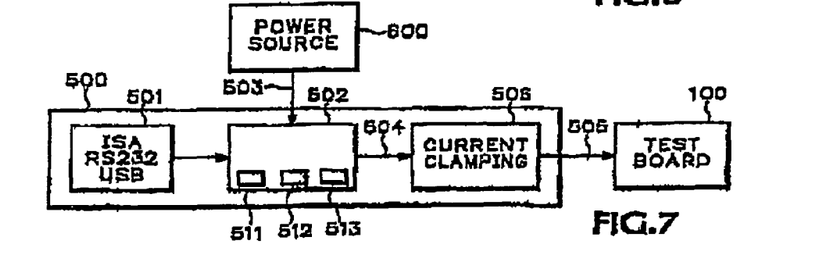
FIG. 7 is a block diagram of an embodiment of a power control circuit in accordance with the present invention.

FIG. 7 is a block diagram of a power control circuit which can be utilized with a test board in accordance with the present invention. In a preferred embodiment, the power control circuit is fabricated on a separate circuit board from the test board and controls the flow of power from an external power supply to the mounting units so as to provide a voltage margin screening function. Referring to FIG. 7, the power control circuit 500 includes a communication interface 501 which can be an ISA interface, RS232 interface, parallel interface, universal serial bus (USB), etc. A voltage control circuit 502 receives input power (shown by arrow 503) from an external power source 600 and controls the voltage of the output power (shown by arrows 504 and 505) provided to the test board 100 in response to commands received from the communication interface. A current clamping circuit 506 monitors the output current and prevents overcurrent conditions from damaging the test board.

A power control circuit in accordance with the present invention can be used to manipulate the supply voltage applied to the monitoring units, thereby allowing the operation of the semiconductor devices to be tested at different supply voltage levels. For example, in a system designed for semiconductor devices rated for 3.3 volt operation, a power control circuit in accordance with the present invention is designed to provide supply voltages between 2.9 volts and 3.7 volts. The power control circuit is preferably connected to the mounting units 160 through the power filtering circuit 180 shown in FIG. 4 through a separate connector (not shown) mounted on the test board.

In a preferred embodiment of the present invention, the communication interface 501 of a power control circuit 500 is connected to a central control station which also controls the operation of the board-type product 200 shown in FIG. 2, as well as a chip handler which can be arranged to mount and remove semiconductor devices 170 to and from the test board 100. Thus, an entire automated test system can be realized in which a chip handler mounts semiconductor devices onto a test board which is preferably already coupled to a board-type product. The central control station then signals the board-type product to operate, thereby testing the semiconductor devices under actual operating conditions. The test can be repeated with the devices operating at several different supply voltages under the control of the power control circuit 500 to screen for voltage margin.

When the tests on one set of semiconductor devices are completed, the chip handler removes the devices and mounts new devices for testing.

Most board-type products have built-in diagnostics that can be used to test the semiconductor devices mounted thereon. For example, computer mother boards invariably have firmware that performs diagnostic self-test of all memory devices at power-up. Therefore, an advantage of the present invention is that the board-level software needed to test the memory devices has already been written and debugged.

A further advantage of the present invention is that it reduces the cost of testing semiconductor devices because it eliminates the need for some of the conventional testers, reduces the number of test items, reduces the number of test steps, and reduces test time. It provides for early detection of defects which might only be detected under actual operating conditions, and therefore, reduces costs associated with warranty returns and product repair. It also enhances the reliability of the test process, and accordingly, improves consumer confidence in the products which use the tested devices.

Having described and illustrated the principles of the invention in a preferred embodiment thereof, it should be apparent that the invention can be modified in arrangement and detail without departing from such principles. For example, although some of the embodiments described above have been described in context of memory devices and computer mother boards, the present invention also applies to the testing of other types of semiconductor devices and with other board-type products.

As a further example, the test board describe above with respect to FIG. 2 is built on a circuit board which is fabricated using as a printed circuit board. However, a test board in accordance with the present invention can be fabricated on other types of circuit boards such as flexible circuit boards, or even on something that is not strictly a "board" so long as it can interconnect the requisite components and accommodate one or more mounting units.

We claim all modifications and variations coming within the spirit and scope of the following claims:

The invention claimed is:

1. A test board for testing semiconductor devices comprising:
   a circuit board;
   a mounting unit attached to the circuit board and adapted to mount a semiconductor device to the test board;
   a connector mounted on the circuit board and adapted to couple the test board to a board-type product; and
   an interface circuit coupled between the mounting unit and the connector, wherein the interface circuit is adapted to compensate for environmental differences between the board-type product and the mounting unit, wherein the interface circuit comprises a clock distribution circuit coupled between the connector and the mounting unit, and wherein the clock distribution circuit comprises a phase locked loop (PLL).

2. A test board for testing semiconductor devices comprising:
   a circuit board;
   a mounting unit attached to the circuit board and adapted to mount a semiconductor device to the test board;
   a connector mounted on the circuit board and adapted to couple the test board to a board-type product;
   an interface circuit coupled between the mounting unit and the connector, wherein the interface circuit is adapted to compensate for environmental differences between the board-type product and the mounting unit; and a power control circuit coupled to the mounting unit and adapted to manipulate a power supply provided to the semiconductor device, wherein the power control circuit comprises a voltage screening circuit adapted to screen the semiconductor device for voltage margin.

3. A test board according to claim 2 wherein the voltage screening circuit is fabricated on a screening board which is separate from the circuit board.

4. A test board for testing semiconductor devices comprising:
a circuit board;
a mounting unit attached to the circuit board and adapted to mount a semiconductor device to the test board;
a connector mounted on the circuit board and adapted to couple the test board to a board-type product; and
a power control circuit coupled to the mounting unit, wherein the power control circuit is adapted to manipulate a power supply provided to the semiconductor device, wherein the power control circuit comprises a voltage screening circuit adapted to screen for voltage margin.

5. A test board according to claim 4 wherein the voltage screening circuit is fabricated on a screening board which is separate from the circuit board.

6. A test board for testing semiconductor devices comprising:
a circuit board;
a mounting unit attached to the circuit board and adapted to mount a semiconductor device to the test board;
a connector mounted on the circuit board and adapted to couple the test board to a board-type product;
a power control circuit coupled to the mounting unit, wherein the power control circuit is adapted to manipulate a power supply provided to the semiconductor device; and
an interface circuit mounted to the circuit board and coupled between the connector and the mounting unit, wherein the interface circuit comprises a clock distribution circuit coupled between the connector and the mounting unit, and wherein the clock distribution circuit comprises a phase locked loop (PLL).

7. A system for testing semiconductor devices comprising:
a board-type product;
a test board coupled to the board-type product, wherein the test board comprises a mounting unit adapted to mount a semiconductor device to the test board, and wherein the test board is constructed to couple signals from the board-type product to the semiconductor device; and
a power control circuit coupled to the mounting unit and adapted to manipulate a power supply to provide a voltage margin screening function to the semiconductor device mounted to the mounting unit.

8. A system according to claim 7 wherein the board-type product has a component side and a back side.

9. A system according to claim 8 wherein the test board is coupled to connection terminals located on the back side of the board-type product.

10. A system according to claim 7 further comprising a chip handler arranged to mount semiconductor devices to the test board.

11. A system according to claim 7 wherein the board-type product is a computer mother board.

12. A system for testing semiconductor devices comprising:
a board-type product;
a test board coupled to the board-type product, wherein the test board comprises a mountain unit adapted to mount a semiconductor device to the test board, and wherein the test board is constructed to couple signals from the board-type product to the semiconductor device; and
a power control circuit coupled to the mounting unit and adapted to manipulate a power supply provided to the semiconductor device mounted to the mounting unit;
wherein the power control circuit comprises:
an external power source; and
a voltage screening board coupled between the external power source and the test board and adapted to perform a voltage margin test by controlling the flow of power from the external power supply to the mounting unit.

13. A method for testing semiconductor devices comprising:
coupling a test board to a board-type product;
mounting a semiconductor device on the test board;
testing the semiconductor device by operating the board-type product; and
eliminating skew between signals on the board-type product and corresponding signals on the test board.

14. A method according to claim 13 further comprising manipulating a power supplied to the semiconductor device.

15. A method according to claim 14 wherein manipulating the power supplied to the semiconductor device comprises supplying power to the semiconductor device from an external power source.

16. A method according to claim 14 wherein manipulating the power supplied to the semiconductor device comprises varying the voltage applied to the semiconductor device.

17. A method according to claim 13 wherein eliminating skew between signals comprises:
generating a clock signal on the test board; and
adjusting the phase of the clock signal.

18. A method according to claim 17 wherein:
generating a clock signal on the test board comprises operating a phase locked loop (PLL) on the test board; and
adjusting the phase of the clock signal comprises adjusting a capacitor coupled to the phase locked loop.

19. A method according to claim 13 further comprising buffering signals from the board-type product to the semiconductor device.

20. A method according to claim 13 wherein:
the board-type product has a component side and a back side; and
coupling the test board to the board-type product comprises coupling the test board to connection terminals located on the back side of the board-type product.

* * * * *

UNITED STATES PATENT AND TRADEMARK OFFICE
CERTIFICATE OF CORRECTION

PATENT NO.         : 7,075,325 B2                                        Page 1 of 1
APPLICATION NO.    : 10/982646
DATED              : July 11, 2006
INVENTOR(S)        : Sang-Jun Park et al.

It is certified that error appears in the above-identified patent and that said Letters Patent is hereby corrected as shown below:

Title page, item [57] Abstract, line 3, the word "tat" should read -- that --;
Column 10, line 10, the word "mountain" should read -- mounting --.

Signed and Sealed this

Sixteenth Day of March, 2010

David J. Kappos
*Director of the United States Patent and Trademark Office*